United States Patent
Doneker et al.

(10) Patent No.: US 11,426,950 B2
(45) Date of Patent: Aug. 30, 2022

(54) ELECTROMAGNETIC ENERGY ABSORBING THREE DIMENSIONAL FLOCKED CARBON FIBER COMPOSITE MATERIALS

(71) Applicant: TANGITEK, LLC, Portland, OR (US)

(72) Inventors: Robert L. Doneker, Portland, OR (US); Kent G. R. Thompson, Portland, OR (US)

(73) Assignee: TANGITEK, LLC, Portland, OR (US)

(*) Notice: Subject to any disclaimer, the term of this patent is extended or adjusted under 35 U.S.C. 154(b) by 440 days.

(21) Appl. No.: 16/265,590

(22) Filed: Feb. 1, 2019

(65) Prior Publication Data
US 2019/0160487 A1 May 30, 2019

Related U.S. Application Data

(62) Division of application No. 14/805,207, filed on Jul. 21, 2015, now abandoned.

(51) Int. Cl.
*B32B 9/00* (2006.01)
*B29C 70/14* (2006.01)
(Continued)

(52) U.S. Cl.
CPC ........... *B29C 70/14* (2013.01); *D06N 7/0097* (2013.01); *H05K 9/009* (2013.01); *Y10T 428/30* (2015.01)

(58) Field of Classification Search
CPC ......... Y10T 428/30; B32B 9/007; H01B 1/04; C01B 31/022; C01B 31/0293; C01B 2202/00; B82Y 40/00
(Continued)

(56) References Cited

U.S. PATENT DOCUMENTS 3,193,712 A 7/1965 Harris
3,211,129 A * 10/1965 Grohl ..................... D04H 11/00
                                                              118/638
(Continued)

FOREIGN PATENT DOCUMENTS

CN   201774688 U   3/2011
EP    0854536 A2   7/1998
(Continued)

OTHER PUBLICATIONS

Extended European Search Report issued in European Patent Application No. 12751876.9, dated Jul. 22, 2014, 11 pages.
(Continued)

*Primary Examiner* — Daniel H Miller
(74) *Attorney, Agent, or Firm* — Miller Nash LLP (57) ABSTRACT

This disclosure relates to electromagnetic absorbing materials, and, more particularly, to a flocked carbon fiber composite material and methods for forming thereof. The flocked carbon fiber material comprises electrostatically applied carbon fibers, having a Z-plane component; electromagnetic modifiers; a substrate; a bonding agent; and an encapsulation agent. The method for forming said flocked carbon fiber composite material comprises preparing carbon fiber strands; separating carbon fiber strand clumps into carbon fiber strands; separating carbon fiber strands into carbon fibers; applying a bonding agent to a substrate; and electrostatically applying the carbon fibers to the substrate. The flocking device used to perform this method comprises an insulative section; a high voltage power source; a container attached to the insulative section; and a filtering section attached to the container.

7 Claims, 8 Drawing Sheets

(51) Int. Cl.
*H05K 9/00* (2006.01)
*D06N 7/00* (2006.01)

(58) Field of Classification Search
USPC ..................................... 428/408; 423/447.1
See application file for complete search history.

(56) References Cited

U.S. PATENT DOCUMENTS

| | | | |
|---|---|---|---|
| 4,253,886 A * | 3/1981 | Aonuma | B22F 1/02 148/105 |
| 4,360,704 A | 11/1982 | Madry | |
| 4,388,623 A | 6/1983 | Crook et al. | |
| 4,684,020 A | 8/1987 | Ohlbach | |
| 4,703,134 A | 10/1987 | Uematsu | |
| 4,822,950 A | 4/1989 | Schmitt | |
| 4,986,372 A | 1/1991 | Ganssle | |
| 5,010,209 A | 4/1991 | Marciano-Agostinelli et al. | |
| 5,028,740 A | 7/1991 | Tomiya | |
| 5,043,538 A | 8/1991 | Hughey, Jr. et al. | |
| 5,170,010 A | 12/1992 | Aldissi | |
| 5,171,938 A | 12/1992 | Katsumata et al. | |
| 5,236,736 A | 8/1993 | Kawakami et al. | |
| 5,300,733 A | 4/1994 | Uematsu | |
| 5,401,901 A | 3/1995 | Gerry et al. | |
| 5,415,204 A | 5/1995 | Kitamura | |
| 5,486,648 A | 1/1996 | Chan et al. | |
| 5,493,070 A | 2/1996 | Habu | |
| 5,539,148 A | 7/1996 | Konishi et al. | |
| 6,104,357 A | 8/2000 | Brage | |
| 6,215,070 B1 | 4/2001 | King | |
| 6,274,066 B1 | 8/2001 | Easter | |
| 6,288,372 B1 | 9/2001 | Sandberg et al. | |
| 6,384,337 B1 | 5/2002 | Drum | |
| 6,503,364 B1 | 1/2003 | Masuda et al. | |
| 6,514,608 B1 | 2/2003 | Foulger | |
| 6,526,860 B2 | 3/2003 | Facciano et al. | |
| 6,697,248 B1 | 2/2004 | Luch | |
| 6,786,771 B2 | 9/2004 | Gailus | |
| 6,825,411 B2 | 11/2004 | Pommerenke et al. | |
| 6,828,501 B2 | 12/2004 | Eves et al. | |
| 6,897,826 B1 | 5/2005 | Kunz | |
| 6,979,709 B2 | 12/2005 | Smalley et al. | |
| 7,087,842 B2 | 8/2006 | Belli et al. | |
| 7,202,418 B2 | 4/2007 | Glew | |
| 7,276,664 B2 | 10/2007 | Gagnon | |
| 7,345,242 B2 | 3/2008 | Chen | |
| 7,449,631 B2 | 11/2008 | Lee et al. | |
| 7,459,627 B2 | 12/2008 | Lee et al. | |
| 7,491,883 B2 | 2/2009 | Lee et al. | |
| 7,688,274 B2 | 3/2010 | Gorrell et al. | |
| 7,738,942 B2 | 6/2010 | Weiner et al. | |
| 7,750,240 B2 | 7/2010 | Jiang et al. | |
| 7,939,167 B2 | 5/2011 | Kim et al. | |
| 8,324,515 B2 | 12/2012 | Stevenson et al. | |
| 8,583,259 B2 | 11/2013 | Liu et al. | |
| 9,055,667 B2 | 6/2015 | Doneker et al. | |
| 2002/0189846 A1 | 12/2002 | Massey | |
| 2003/0122111 A1 | 7/2003 | Glatkowski | |
| 2004/0020681 A1 | 2/2004 | Hjortstam et al. | |
| 2004/0154911 A1 | 8/2004 | Burgess et al. | |
| 2005/0001780 A1 | 1/2005 | Msenbrey | |
| 2005/0011612 A1 | 1/2005 | Yakushiji et al. | |
| 2005/0045358 A1 | 3/2005 | Arnold | |
| 2005/0078050 A1 | 4/2005 | Aisenbrey | |
| 2006/0083948 A1 | 4/2006 | Kawaguchi et al. | |
| 2006/0237221 A1 | 10/2006 | Glew | |
| 2007/0003761 A1 | 1/2007 | Miyazono et al. | |
| 2007/0068787 A1 | 3/2007 | Burgess et al. | |
| 2007/0089285 A1 | 4/2007 | Utecht et al. | |
| 2007/0116916 A1 | 5/2007 | Ito et al. | |
| 2007/0293086 A1 | 12/2007 | Liu et al. | |
| 2008/0018549 A1 | 1/2008 | Suzuki et al. | |
| 2008/0042413 A1 | 2/2008 | Coleman et al. | |
| 2008/0058467 A1 | 3/2008 | Takagi et al. | |
| 2008/0129638 A1 | 6/2008 | Ong | |
| 2008/0283290 A1 * | 11/2008 | Niino | H05K 9/0001 174/350 |
| 2009/0095523 A1 | 4/2009 | Stevenson et al. | |
| 2009/0104405 A1 | 4/2009 | Patten et al. | |
| 2009/0111325 A1 | 4/2009 | Ju | |
| 2009/0114420 A1 | 5/2009 | Winterhalter | |
| 2009/0120664 A1 | 5/2009 | Clark et al. | |
| 2009/0120681 A1 | 5/2009 | Matsuzaki | |
| 2009/0130995 A1 | 5/2009 | Wang Chen | |
| 2009/0159328 A1 | 6/2009 | Dai et al. | |
| 2009/0287426 A1 | 11/2009 | Kukowski | |
| 2009/0291608 A1 | 11/2009 | Choi et al. | |
| 2010/0000754 A1 | 1/2010 | Mann et al. | |
| 2010/0052992 A1 | 3/2010 | Okamura et al. | |
| 2010/0086729 A1 | 4/2010 | Long | |
| 2010/0096160 A1 | 4/2010 | Gareis et al. | |
| 2010/0159240 A1 | 6/2010 | Shah et al. | |
| 2010/0178487 A1 | 7/2010 | Arai et al. | |
| 2010/0188833 A1 | 7/2010 | Liang et al. | |
| 2010/0236812 A1 | 9/2010 | Laudenslager et al. | |
| 2010/0239798 A1 | 9/2010 | Becklin | |
| 2010/0300744 A1 | 12/2010 | Romanko et al. | |
| 2011/0005808 A1 | 1/2011 | White et al. | |
| 2011/0062134 A1 | 3/2011 | Lochtman et al. | |
| 2011/0209909 A1 | 9/2011 | Doneker et al. | |
| 2011/0253441 A1 | 10/2011 | Doneker et al. | |
| 2011/0253475 A1 | 10/2011 | Doneker et al. | |
| 2011/0266023 A1 | 11/2011 | Doneker et al. | |
| 2011/0309845 A1 | 12/2011 | Kukowski | |
| 2012/0229358 A1 | 9/2012 | Doneker et al. | |
| 2014/0360772 A1 | 12/2014 | Coppola et al. | |

FOREIGN PATENT DOCUMENTS

| | | |
|---|---|---|
| EP | 1191351 A2 | 3/2002 |
| EP | 1447819 A1 | 8/2004 |
| EP | 1612187 A1 | 1/2006 |
| JP | 54139358 A | 10/1979 |
| JP | 55068703 A | 5/1980 |
| JP | 57166702 A | 10/1982 |
| JP | 58184805 A | 10/1983 |
| JP | 59061203 A | 4/1984 |
| JP | 60010806 A | 1/1985 |
| JP | 0621683 | 1/1994 |
| JP | 2004095847 A | 3/2004 |
| JP | 2005012841 A | 1/2005 |
| JP | 2005285923 A | 10/2005 |
| JP | 2006332260 A | 12/2006 |
| JP | 2009174956 A | 8/2009 |
| JP | 2010062571 A | 3/2010 |
| KR | 20110016661 A | 2/2011 |
| TW | 200929725 B | 7/2009 |
| TW | 200929459 B | 10/2014 |
| WO | 2005122331 A1 | 12/2005 |
| WO | 2008012300 A1 | 1/2008 |
| WO | 2010095925 A1 | 8/2010 |

OTHER PUBLICATIONS

Koch et al., "0.6-M Antennae for the Amiba Interferometry Array," Proceedings of the European Conference on Antennas and Propagation: EuCAP 2006 (ESA SP-626). Nov. 6-10, 2006, Nice, France. Eds.: Lacoste et al. Published on CDROM, p. 668.1.
Liu et al., "Measurement on Dipole Antenna with Light Polarized Nano-Material(PNM) Textile Reflector" IEEE MTT-S Intl. Microwave Symposium Digest, 2009. Jun. 7-12, 2009, pp. 1069-1072.
Park et al., "Application of MWNT-added glass fabric/epoxy composites to electromagnetic wave shielding anclosures," Composite Structures, vol. 81, No. 3, Dec. 2007, pp. 401-406.

* cited by examiner

ELECTROMAGNETIC ENERGY ABSORBING THREE DIMENSIONAL FLOCKED CARBON FIBER COMPOSITE MATERIALS

CROSS-REFERENCE TO RELATED APPLICATIONS

This application is a divisional application of co-pending U.S. non-provisional patent application Ser. No. 14/805,207, filed Jul. 21, 2015, which incorporated by reference U.S. non-provisional patent application Ser. No. 13/172,694, filed Jun. 29, 2011 (which issued on Apr. 8, 2014 as U.S. Pat. No. 8,692,137) and U.S. non-provisional patent application Ser. No. 13/431,746, filed Mar. 27, 2012 (which issued on Oct. 7, 2014 as U.S. Pat. No. 8,854,275), each of which is incorporated herein by reference.

TECHNICAL FIELD

This disclosure relates to electromagnetic absorbing materials, and, more particularly, to a flocked carbon fiber composite material. The flocked carbon fiber composite material further possesses other desirable properties for use in a number of applications.

BACKGROUND

Electromagnetic noise can escape or otherwise be emitted from electrical components which can interfere with other electronic circuits or devices nearby. Signals transmitted over electrical cables or wirelessly over the air can be impacted, even severely disrupted, by the electromagnetic emissions. Most enclosures housing electronics have edges, seams, openings, physical interfaces, and the like, through which the electromagnetic noise can escape. The types of enclosures that are susceptible to such issues include personal computers, computer server equipment, broadcast equipment, sensitive satellite control devices, cellular tower equipment, handheld devices, mobile computing systems and indeed, any enclosure that surrounds or contains electrical components such as circuit elements, conductors, or the like.

In some cases, it is desirable to prevent electromagnetic radiation or noise originating from external sources from penetrating the enclosure through similar edges, seams, openings, interfaces, and the like, which can otherwise cause unwanted interference with circuits and other components located within the enclosure. This can be of particular concern with test chambers or other similar types of test equipment and enclosures.

Government agencies such as the Federal Communications Commission (FCC), among other private and public bodies, require the adherence to exacting standards for the emission of electromagnetic radiation. Much effort is expended in complying with the various laws and rules governing such emissions. Compliance through testing, redesigns, certifications, and the like, quite often requires the devotion of significant resources and time by product developers.

Conventional techniques for addressing these problems include redesigning the enclosure to reduce the number of places from which electromagnetic energy escapes and/or enters the enclosure. Other typical approaches include covering the seams and openings using sheet metal. Still other approaches require arduous testing after each iteration of enclosure redesign, leading to further enclosure redesigns.

Efforts to address the consequences of unwanted electromagnetic noise can unfortunately lead to less efficient designs. For instance, the energy efficiency of the system can become a concern because one approach for overcoming unwanted electromagnetic interference is to boost the signal power to compensate for the noise. Such approaches can lead to energy waste and can be environmentally unwise.

There are several different types of microware absorber material systems available on the market today for the absorption and/or transfer of electromagnetic noise. Materials in the market include lossy foam block pyramidal type absorbers, which are one of the highest performance microwave surface reflection attenuators. Multiple sheets of carbon impregnated foam can also be used to create flat laminate absorbers. Reflections can occur at any foam surface, the magnitude of the reflection being dependent on the density of the material. Variations include high-power absorbers of a honeycomb substrate made from a phenolic-based material. Lossy films are coated on the walls of the honeycomb for effective absorption of incident electromagnetic waves.

The disclosed invention provides for a superior form of such a material, which reduces unwanted electromagnetic interference. Further, the inventive material disclosed herein has a number of advantageous aspects that make it useful even outside the field of electromagnetics.

SUMMARY

One objective of the disclosed invention is to develop a three-dimensional (3D) or "Z-plane" material with enhanced electromagnetic properties. The disclosed invention achieves this by minimizing the cross section of conductive materials while presenting a suitable surface to support standing waves, which was achieved by standing the conductive carbon fibers on their ends. Another objective is to optimize placement of ferromagnetic materials to be in regions of maximum electrical current. Placing the ferrites and/or other magnetic materials mid length around the carbon fibers, where the maximum current flow occurs, yields maximum absorption at the carbon fibers resonant frequency. However, the position of the magnetic materials along the carbon fibers may vary within the scope of the disclosed invention. Further, one or more of the magnetic materials may attach to one or more carbon fibers with the scope of the invention. Additionally, by combining fibers of different lengths the various absorbed frequencies can be combined to increase the bandwidth of the absorbed electromagnetic spectrum.

The material's electromagnetic energy absorption can be measured by how much energy is reflected back from the surface of the sample. One of the ways to measure the reflectivity of materials is with the Naval Research Laboratory Arch Reflectivity Test. Reflectivity is defined as the reduction in reflected power caused by the introduction of an absorbent material. This reduction of power is compared to a perfect reflector such as a highly conductive flat metal plate. A transmit and receive antenna are located above the test sample at equal angles from the centerline so as to measure the reflected signal. Distances to the sample as well as its size are determined by the frequencies of interest, with a 12×12 inch sample suitable for 2-18 GHz testing. A network analyzer is used to perform the measurements. Preliminary data of the flocked carbon fiber composite material shows absorber performance comparable to a conventional narrow band magnetically loaded cavity resonant absorber while at the same time offering broader bandwidth of carbon foam absorbers at lower weight (lighter). The optimum placement of electromagnetic components results in a significant weight savings over other conventional material combinations.

In addition to (or even in lieu of) the electromagnetics aspects of the materials, other properties of the below described materials make it desirable for a number of other applications. Such properties include but are not limited to the following qualities: lightweight, durability, flexibility, sound insulation, heat transfer/dispersion, rough/textured nature and/or absorption of a variety of wavelengths, including without limitation wavelengths within the microwave spectrum. Applications utilizing these materials may use one or more of these disclosed properties. As an illustration, in one embodiment, the materials may be used in an application that makes several properties desirable. However, in other applications, the desirability of one property may outweigh any disadvantages imposed by other properties. Therefore, this description should not be limited to presuppose that all properties must be advantageous to any given application.

The below described materials may be used in a number of applications. In one embodiment, such applications include but are not limited to electronic enclosures, microwave absorbing surfaces, gaskets, and noise dampening energy efficient tape. In another embodiment, the materials may be used in applications that utilize the rough/textured surface of the material. Such applications include without limitation shoe tread, tires, tracks, conveyor belts, material handling systems, non-skid surfaces, and serpentine belts. The lightweight and textured nature of the material makes it particularly useful, such as for a shoe tread. Further, another embodiment may utilize the heat transfer/dispersion properties of the material, such as a fabric or layer(s) for clothing which assists in transferring heat away from the body.

DETAILED DESCRIPTION OF THE EMBODIMENTS

Embodiments of the disclosed technology generally include electromagnetic energy absorbing three dimensional flocked carbon fiber composite and methods for forming said material.

DETAILED DESCRIPTION

Embodiments of the invention include noise dampening composite materials designed so as to absorb unwanted or stray electromagnetic fields. The terms "electromagnetic noise" or "interference" as used herein generally refers to unwanted electromagnetic waves or signals having the potential to disrupt the operation of electronic equipment or other devices. It should be understood, however, that the embodiments disclosed herein can provide beneficial electromagnetic wave dampening for any type of electromagnetic signal, whether or not it is considered "noise" per se, and whether or not actual disruption is caused, and therefore, such terms should be construed broadly.

FIGS. 1-12 illustrate one embodiment of the process to form electromagnetic absorbing materials, and, more particularly, to form a flocked carbon fiber composite material. The disclosed embodiment is illustrative and should not be construed to be limiting or exclusive in nature. Some embodiments of the formation of the flocked carbon fiber composite material may include additional or less steps than disclosed herein. The order or arrangement of steps is exemplary only and may be altered to achieve the disclosed invention in scope and spirit. Further different and/or additional equipment or techniques may be utilized within the scope of the disclosed invention.

Figure 1:
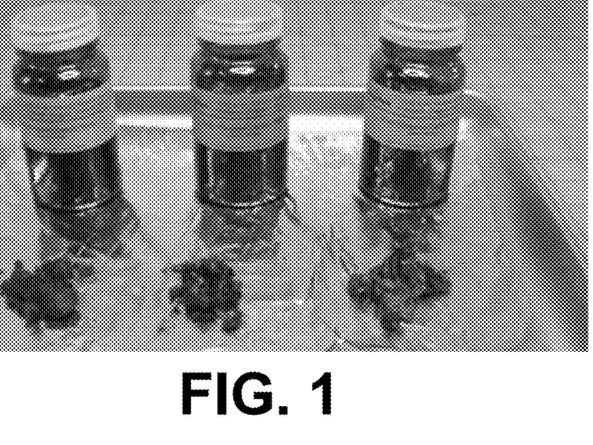
FIG. 1 illustrates flocked Polyacrylonitrile (PAN) or Pitch based carbon fibers.

FIG. 1 illustrates the different lengths of raw carbon fibers, which can be utilized for the production of the flocked composite. As used in the disclosed invention, the term, "carbon fibers," refers to individual carbon fibers and "carbon fiber strands" refers to carbon fiber tows or groupings of carbon fibers. Lengths of the carbon fibers ranging from 0.5 mm to 24.0 mm can be used to make carbon flock, with one embodiment utilizing lengths from 1.0 mm to 6.0 mm. Other embodiments use lengths of 2.0 mm to 3.0 mm. In some embodiments, a mixture of lengths of carbon fibers may be utilized in one production of flocked composite material. In other embodiments, only one size will be used, e.g. all carbon fiber strands are 2.0 mm in length when applied using the flocking method.

Length of carbon fiber determines the frequency of absorption. The length of the fiber and the frequency of absorption are inversely proportional. As the carbon fiber strand length decreases, the frequency of absorption increases. The reverse is true as the carbon fiber length increases, thus absorbing lower frequencies.

Figure 2:
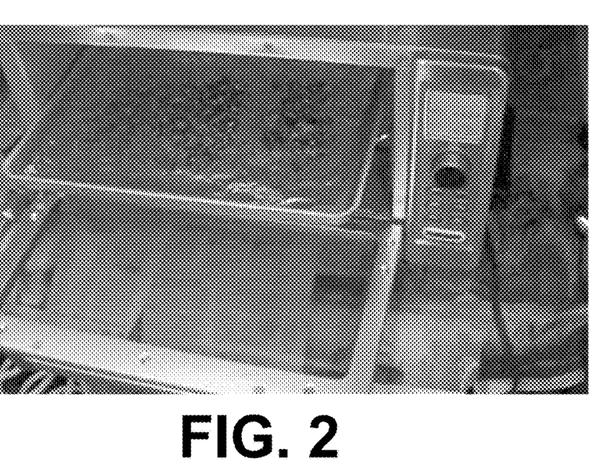
FIG. 2 illustrates the method for preparing carbon fiber fibers by heating to remove sizing.

FIG. 2 illustrates the step of preparing the carbon fiber strands by removing sizing from carbon fiber strands. "Sizing" on the carbon fiber strands is applied by many manufacturers to protect carbon fiber strands during shipping, weaving or warping and to promote adhesion. The sizing protects the carbon fiber strands from damage, such as breakage, tuffs or tearing. If the carbon fiber strands lack said sizing, this step will not be present in the disclosed method. Sizing varies among manufacturers and may consist of any one or more of the following materials: proprietary hydroxyl, epoxy formulations and/or thermoplastics.

In one embodiment, the carbon fiber strands are prepared by heating in range of 500° F. to 900° F. The temperature used to prepare the carbon fiber strands may vary outside of this precise range and still meet the scope and spirit for the disclosed invention. The carbon fiber strands may be heated to this temperature utilizing a variety of equipment and types of heat. Types of heat include electrical-generated heat, steam heat, and fuel-based heat. In one embodiment, the heating device may be a conventional oven 202. The carbon fiber strands to be prepared may be placed on a baking pan 204 in a single layer or multiple layers. For industrial applications, other types of heating equipment may be utilized, e.g. continuous flow ovens. The type of heating equipment will depend on the desired temperature, the amount of material being heated, the duration of the heating process, and the frequency of the heating applications.

In another embodiment the sizing is removed chemically by the action of various solvents suitable for the removal of hydroxyl and epoxy compounds such as but not limited to Dichloromethane (DCM), Trichloromethane (chloroform), Dimethylformamide (DMF), Methyl Ether Ketone (MEK), Dimethyl sulfoxide (DMSO), or Acetone.

Figure 3:
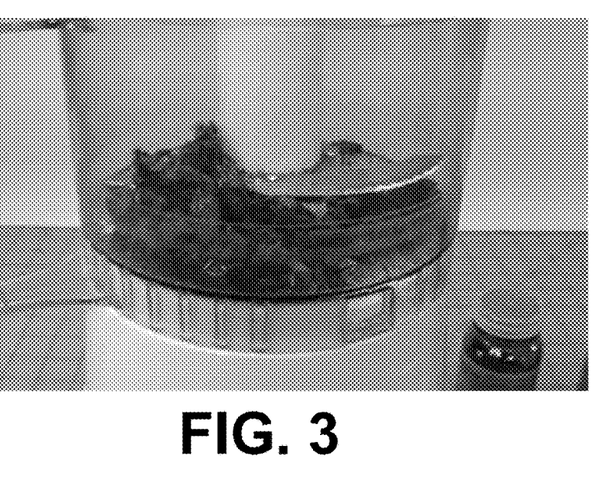
FIG. 3 illustrates the method for mechanically preparing the flock to remove clumps.

FIG. 3 illustrates an optional step in the flocking method. Following the heating process, the carbon fiber strands may require mechanical separation. The preparation of the carbon fiber strands may result in the carbon fiber strands forming clumps of like-sized carbon fiber strands. For example, strands of 1.0 mm in length will gather together while strands of 2.0 mm form a different cluster. Therefore, to assist in the uniform application of the carbon fiber strands during the flocking method, the clusters may be separated, e.g. in a food processor.

Figure 4:
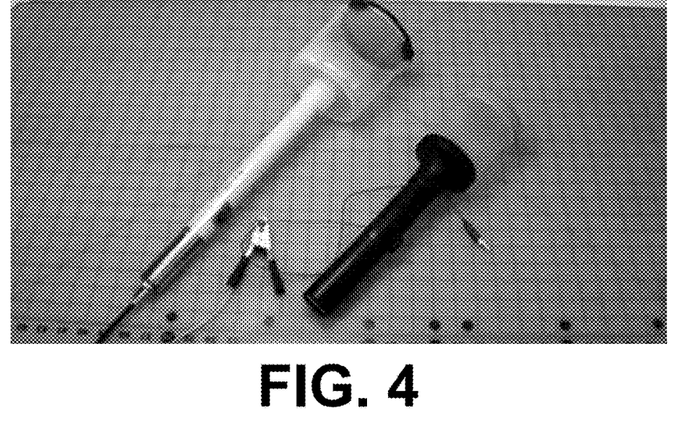
FIG. 4 illustrates the flocking equipment that includes a power supply (internal or external), a wand handle to maintain a safe working distance from the high voltage present, and a container with a metal screen attached to hold the fibers.

FIG. 4 illustrates the equipment utilized in the flocking method. The disclosed equipment is only exemplary in nature. The flocking method may use different types of techniques or equipment and achieve the desired results. In one embodiment, an insulative section in the form of a wand device 400 is utilized. The device may be varied in size and power to accommodate fiber size and surface area of the substrate. The device has a wand handle 402 to enable a user to maintain a safe distance from the high voltage used during the flocking method. The power supply runs into the bottom of the wand handle and runs up through the center. As is described in more detail below, the voltage can be varied between 2 KV to 200 KV. Separation between the user and the high voltage may be achieved in a number of manners, such as insulated wand, handle, or cable. As shown in FIG. 4, the wand device comprises a container 404 placed at the top of the wand. A filtering section, in one such embodiment, a screen 406, is then placed over the container to hold the carbon fibers within the cup. In certain embodiments, the filtering section has a plurality of holes that allow passage of the carbon fibers upon manipulation. The size of the plurality of holes fall within a wide range of sizes (which are expressed in units per inch) including but not limited to #16, #8, #4 for ¹/₁₆", ⅛", and ¼" respectively. In one embodiment, a screen with a hole size of #16 may be used for short pile lengths of 1-2 mm. In another embodiment, a screen with a hole size of #4 may be used for longer fiber pile lengths. Such a size holds the carbon fibers within the container while still allowing adequate passage of the carbon fibers through the screen when needed.

Figure 5:
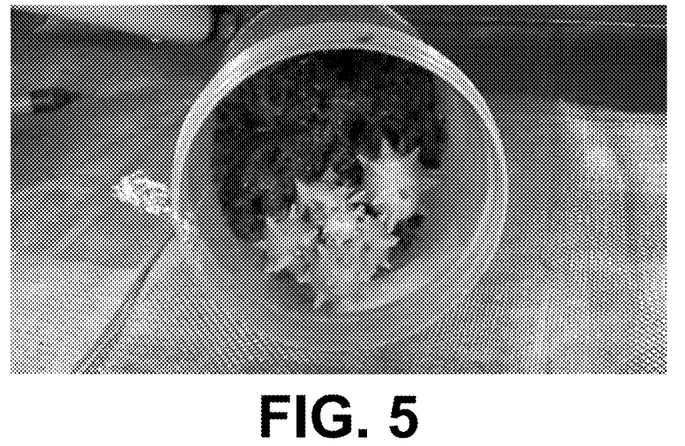
FIG. 5 illustrates agitation balls utilized in the method to separate the carbon tows into separate fibers.

FIG. 5 illustrates the optional step of further separating of the carbon fiber strands from tows into individual carbon fibers. One such method to separate out the carbon fibers is the use of agitation balls 500. The exemplary agitation balls are formed using 3-D printing methods and made of 3-D printing materials, such as plastic. The agitation balls are approximately ½ inch to 1½ inches in diameter and comprise a spherical center with small spikes protruding from said center. In one embodiment, the carbon fiber strands are placed in a container with agitation balls. The container is then subjected to a shaking force, which promotes the fibers to fall through the appropriately sized screen. The spikes 502 on the exemplary balls penetrate between the individual carbon fibers and cause them to separate from one another. Following the agitation step, the remaining carbon fibers may exist as any of the following: a mixture of individual carbon fibers and carbon fiber strand tows or individual carbon fibers only. On a larger scale, such as in a manufacturing process, other methods and/or equipment may be used and still meet the spirit and scope of the disclosed invention. Such methods to separate the carbon fibers include without limitation vibration, electrostatic separation and spraying methods.

While the above description of separating the carbon fibers discloses the use of mechanical measures, it should be recognized that additional techniques and devices may be utilized to achieve this desired result. Such techniques and devices may include but are not limited to chemical or electrical approaches that will cause carbon fiber strands to separate into individual carbon fibers.

Figure 6:
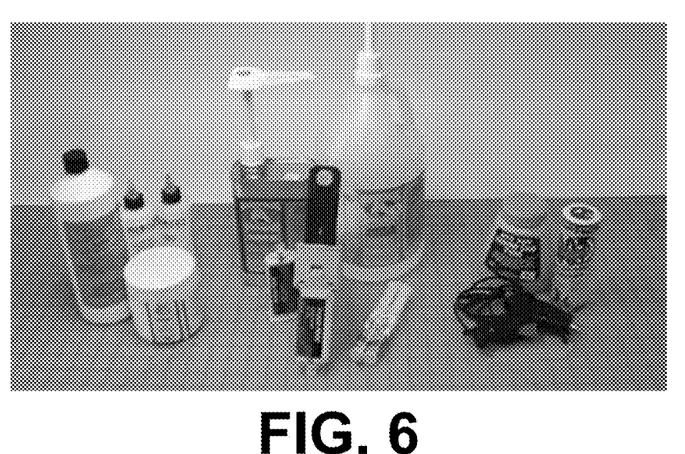
FIG. 6 illustrates the different types of adhesives can be used in the method to bond the carbon fibers to the substrate. Some adhesives shown are on the left acrylics, center are epoxies, and to the right are thermoplastic. (Not shown are the solvent based rubber cements or pressure sensitive adhesives)

Once the carbon fibers are separated, a substrate must be prepared to bond with the carbon fibers during the flocking process. FIG. 6 illustrates a plurality of bonding agents that may be utilized to achieve this end. However, any type of bonding agent may be utilized within the scope and spirit of this invention. A bonding agent is applied to a substrate to facilitate the process. Such bonding agents comprise acrylics, epoxies, urethanes, polyesters, latex, thermoplastics, solvent based rubber cements and/or pressure sensitive adhesives (PSA). Any bonding agent may be utilized in isolation or in conjunction with other bonding agents. The type of bonding agent chosen will depend on a variety of factors, such as the type of substrate, the amount of carbon fibers to be applied, other materials to be applied to the substrate, temperatures to be withstood, working time, cost as well as other factors.

Once the bonding agent is in place on the substrate, the flocking process described in detail below must commence while the bonding agent is still primed to bond the carbon fibers with the substrate. The exact timing varies depending on the type of bonding agent and substrate utilized. In one embodiment, the exemplary bonding agent, polyvinyl acetate (PVA) glue, requires the flocking process to begin within a few minutes to prevent an air surface skin from forming on the bonding agent which may interfere with flock adhering to the substrate. The application areas may be environmentally controlled to maximize the adhesive open time. In the event the bonding agent dries before the carbon fibers are applied, the bonding agent may be reapplied without adverse impact. Further, certain bonding agents may require multiple applications to assist in bonding the carbon fibers to the substrate.

A variety of substrates may be used in the flocking process. The substrate of the fabric may be woven or non-woven spun fibers as well as other suitable materials. Further, the materials forming the substrate may be conductive, insulative or a mixture of conductive and insulative materials. Such substrates may include without limitation metal sheet and foils, ceramics such as concrete, wood and paper products, as well as plastics able to withstand the 250° F. processing temperature for the powder coat bonding of the ferromagnetic materials. Materials derived from ceramics, cellulose, or resins may be used as a substrate in some embodiments. The surface of the substrate may be flat, irregular, circular or a variety of different textures.

Figure 7:
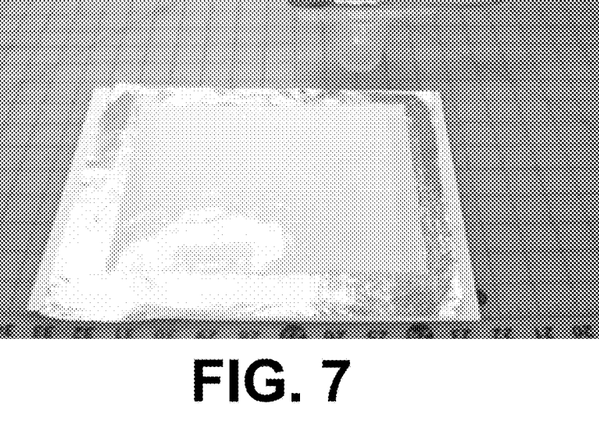
FIG. 7 illustrates that in the method, a conductive plate of aluminum foil is placed behind adhesive-coated material.

FIG. 7 illustrates a conductive material 702 is placed behind the substrate 704 coated with a bonding agent. A variety of conductive materials may be used in the process. In one embodiment, the conductive material in the form of aluminum foil is placed behind substrate that has been coated with an adhesive, such as Poly Vinyl Acetate (PVA). The conductive plate forms the negative ground potential behind the insulating substrate (i.e. some types of glue can have poor surface charging properties). This ground acts to attract the positively charged carbon fibers. If applying to a conductive substrate it may act as the ground potential. Once the conductive material is in place, the carbon fibers may be applied to the substrate.

Figure 8:
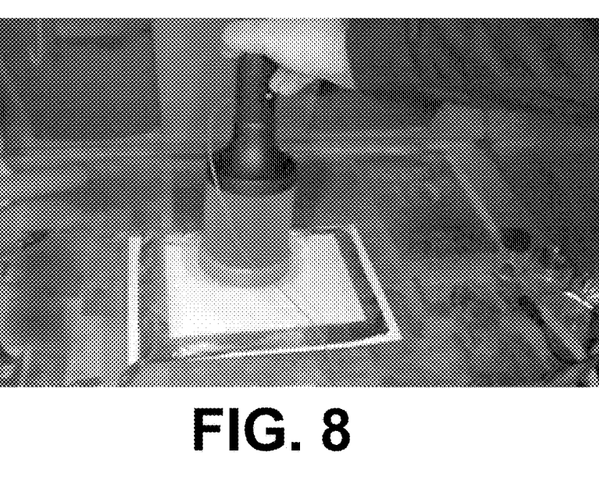
FIG. 8 illustrates the method for applying carbon fiber to a substrate by flocking (Electrostatic Particulate Deposition) at voltage potential of 2 KV to 200 KV between the screen and the metal backing plate.

FIG. 8 illustrates the process of applying the carbon fibers to the substrate through the flocking process. As shown in the illustrative photograph, the flocking equipment previously described is loaded with the carbon fibers to be applied to the substrate. The carbon fibers are placed in the container attached to the wand handle. The filtering mechanism, in this case, a screen 406, is applied to the top of the container 404. To apply the carbon fibers to the substrate, the flocking device is placed near the substrate surface. The distance that the flocking device is placed from the substrate surface varies in the range of 1"-12". In some embodiments, the flocking device is placed within 1" to 4" of the substrate surface for a small wand with 3 kV of power. In other embodiments, a larger wand with 15 kV-200 kV of power is placed within 4"-12" of the substrate surface. The distance the flocking device is placed may vary without significantly impacting the ability of the charged carbon fibers from bonding with the substrate.

The angle of the flocking device with respect to the substrate may also vary. In the embodiment shown in FIG. 8, the flocking device is placed at a 90° angle to the substrate, i.e. with the screen placed parallel to the substrate. However, this angle may be altered without negatively impacting the disclosed invention. As the angle varies, the angle at which the carbon fibers are approaching the substrate during the flocking process will similarly vary. The varied angles may result in electromagnetic differences giving a slight angle bias to the normal field absorbed.

Once the flocking device is within range of the substrate placed on the conductive material/plate and the carbon fibers are in loaded in the container, the high voltage power source is turned on. The voltage may vary, but in the embodiment shown in FIG. 8, the voltage applied to the flocking device is approximately 3 kV. The voltage causes the carbon fibers to become electrically charged and attracted to the conductive material placed behind the substrate. The voltage potential between the screen and the metal backing plate is between 2 KV to 200 KV. The electrostatically charged carbon fibers pass through the filtering mechanism and bond with the bonding agent previously applied to the substrate.

The flocking method causes the carbon fibers to stand on end resulting in a Z-plane orientation with respect to the substrate. Illustrative embodiments of Z-plane materials include but are not limited to velvet, corduroy, and velveteen. The Z-plane orientation has certain advantages, such as maximizing the surface area for absorbing energy while at the same time minimizing the reflective surface of carbon fibers. Additional materials may be bonded to the substrate in addition to the carbon fibers including but not limited to insulative (dielectric materials) and some types of coated metal strands.

Figure 9:
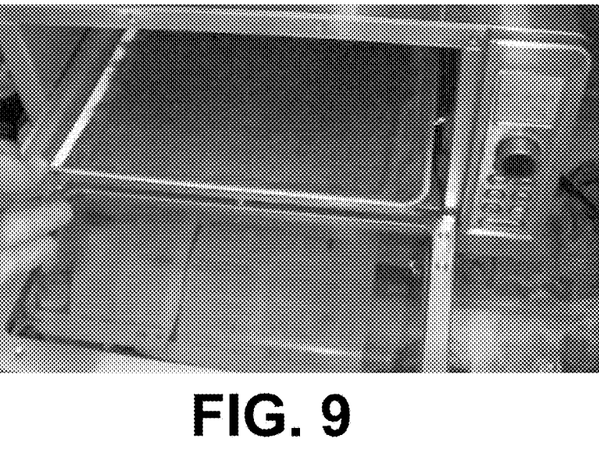
FIG. 9 illustrates the method for curing the flocked material substrate in an oven.

FIG. 9 illustrates the adhesive curing step in the flocking process. During the curing step, the adhesive sets with the carbon fiber ends and firmly attaches the carbon fibers to the substrate. To cure the flocked material, the substrate with the bonded carbon fibers is placed near a heating element, such as in an oven in one embodiment. Suitable heating elements vary and may include electrical heat, steam heat, and open flame. The flocked material may be placed in the vicinity of a heating element any time, varying from immediately after the carbon fibers are applied to the substrate to when the adhesive has fully dried. Further, other steps may occur before or after the curing step without impacting the disclosed invention. The temperature to cure the flocked material is within a range of ambient up to 250° F. In one embodiment, the oven is heated to a temperature of 225° F.

Figure 10:
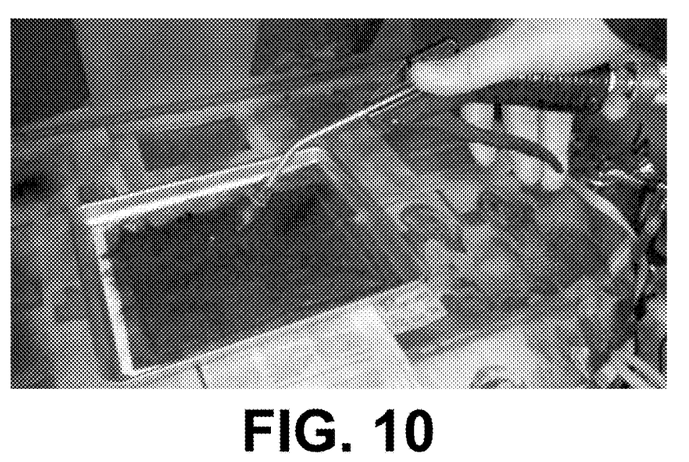
FIG. 10 illustrates the step in the method of removing the excess flocked material by compressed air.

FIG. 10 illustrates the removal of excess carbon fibers that did not bond to the substrate. In one embodiment, compressed air is applied to the flocked material to remove unattached carbon fibers. A variety of methods may be used to remove the excess carbon fibers, including without limitation mechanical manipulation of the flocked material, such as hitting the substrate with mechanical beaters, or vacuuming the pile. Any method suitable for removing excess carbon fibers may be utilized within the scope and spirit of the disclosed invention. In the event an insufficient amount of carbon fibers is bonded to the substrate, one or more of the above-referenced steps may be repeated to allow carbon fibers to bond to the substrate.

Figure 11:
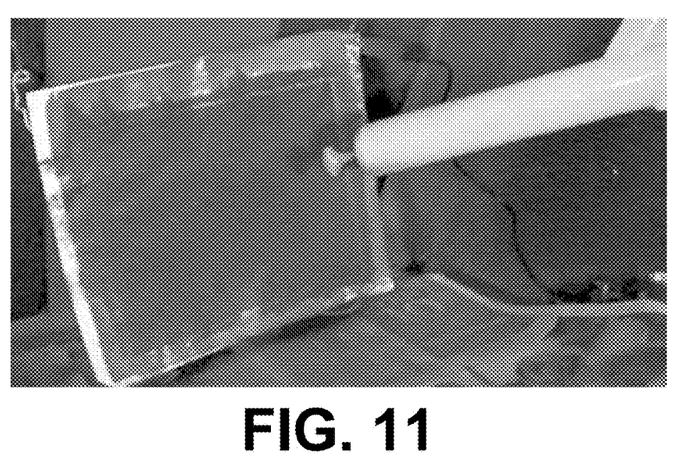
FIG. 11 illustrates the step in the method of applying carbon fiber flock material using electrodeposited power coating at 15-25 kV.

FIG. 11 illustrates the optional step of applying additional materials to the flocked carbon fiber material. The materials may bond to the carbon fibers only, the substrate only, and/or both. Such materials include but are not limited to resins containing ferromagnetic metal micro particles. As illustrated in FIG. 11, in one embodiment, resins containing ferromagnetic metal micro particles are applied using electrodeposited powder coating at 15-25 kV. The electric charge assists in the coating of each carbon fiber. However, it is not necessary that all carbon fibers to be coated to meet the scope and spirit of the invention.

Figure 12:
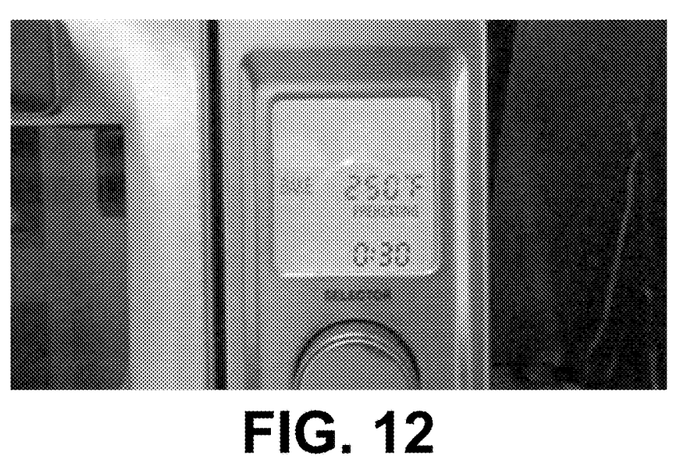
FIG. 12 illustrates the step in the method of baking the powder coat materials on the carbon fiber flock material.

FIG. 12 illustrates the optional step of bonding the additional materials to the carbon fibers and/or the substrate. Depending on the type of additional materials added to the carbon fibers and/or the substrate, different methods will be utilized to bond the additional materials; such methods include but are not limited to heat, chemicals, electrodepositing, electroplating, plasma spraying, or ion implantation. One skilled in the art will recognize the bonding method will vary depending on materials to be applied. FIG. 12 demonstrates the process for bonding resins containing ferromagnetic metal micro particles through the use of heat. As shown, in one embodiment, once the resins containing ferromagnetic metal micro particles are applied to the carbon fibers and/or substrate, the powder coated materials are placed in an oven at 250° F. The materials are left in the oven for 15 to 30 minutes depending on temperature. Once heat has been applied for the prescribed period of time, the powder coated materials are removed from the oven and allowed to cool.

Figure 13:
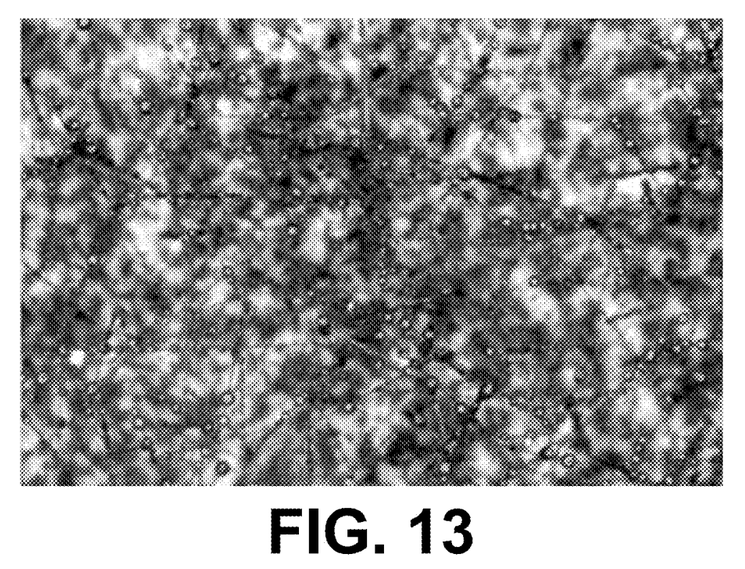
FIG. 13 illustrates a microscopic view of the application of the iron ball powder coat, which leaves small (less than 0.1 mm) solidified droplets along the length of the carbon fibers
Figure 14:
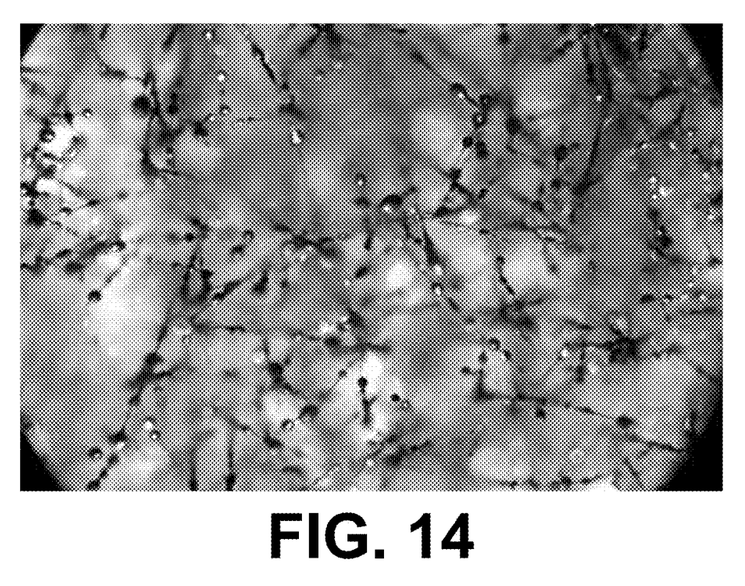
FIG. 14 illustrates a microscopic view of the top 1 mm of the flocked carbon fiber material showing the 0.007 mm carbon fibers, which are surrounded by a bonded power coating with ferrite added.
Figure 15:
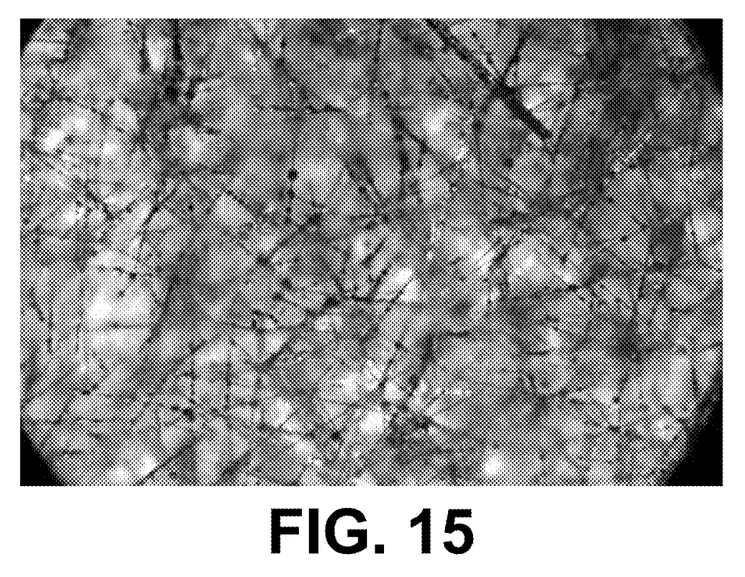
FIG. 15 illustrates a microscopic view of the middle 2 mm of the flocked carbon fiber material.
Figure 16:
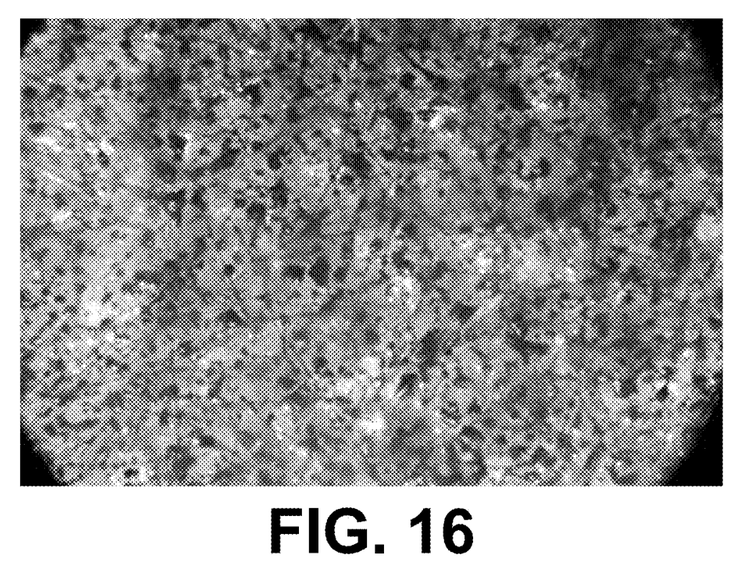
FIG. 16 illustrates a microscopic view of the bottom 1 mm of the flocked carbon fiber material including the substrate.
Figure 17:
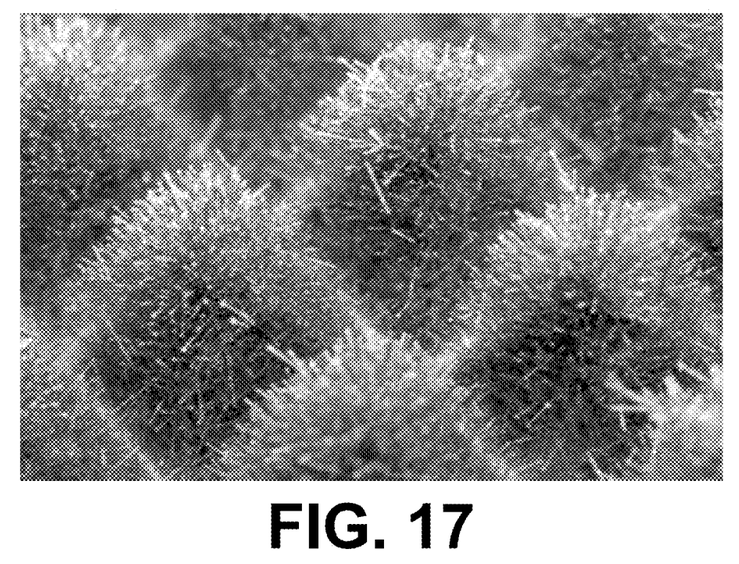
FIG. 17 illustrates a microscopic view of the flocked carbon fibers applied to an irregular surface.
Figure 18:
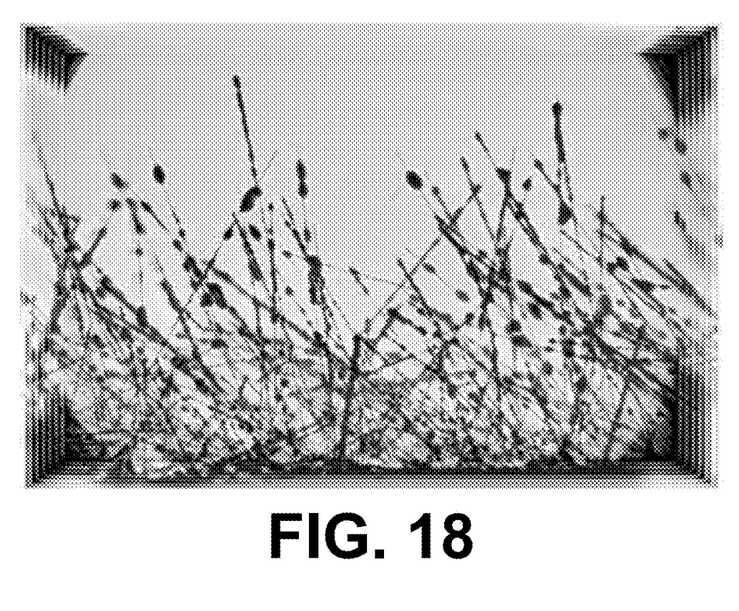
FIG. 18 illustrates a microscopic, side view composed of multiple stacked images of the carbon fiber material.

FIG. 13-18 illustrate photographs of flocked material prepared with resins containing ferromagnetic metal micro particles taken using a conventional laboratory microscope. FIG. 13 shows that the application of said resins results in small (less than 0.1 mm) solidified droplets 1302 along the length of the carbon fibers 1304 of the flocked materials. FIG. 14 provides a perspective of the top 1 mm of the 0.007 mm carbon fibers surrounded by bonded powder coating with ferrite added. FIG. 15 shows the top 2 mm of the same 0.007 mm carbon fibers. FIG. 16 shows the bottom 1 mm of the flocked material, including but not limited to the substrate. FIG. 17 shows an image of flocked carbon fibers from a microscope focused at 40×, demonstrating how the carbon fibers may bind to substrate with an irregular surface. As shown, the flocking process results in the carbon fibers following the contours of the substrate's surface, which in this embodiment are mound structures with valleys between said mounds. FIG. 18 illustrates the Z-plane nature of the carbon fibers following the flocking process. FIG. 18 shows a side view and contains several Figures layered together, utilizing a stacked focus technique, to show the carbon fibers. As can be seen in FIG. 18, the application of the resins containing ferromagnetic metal micro particles results in one or more said particles attaching along one or more carbon fibers. Further, one reviewing FIG. 18 will note that the carbon fibers may attach at a variety of angles in the disclosed invention. Some of the carbon fibers form structures with other carbon fibers, such as trapezoidal structures.

Figure 19:
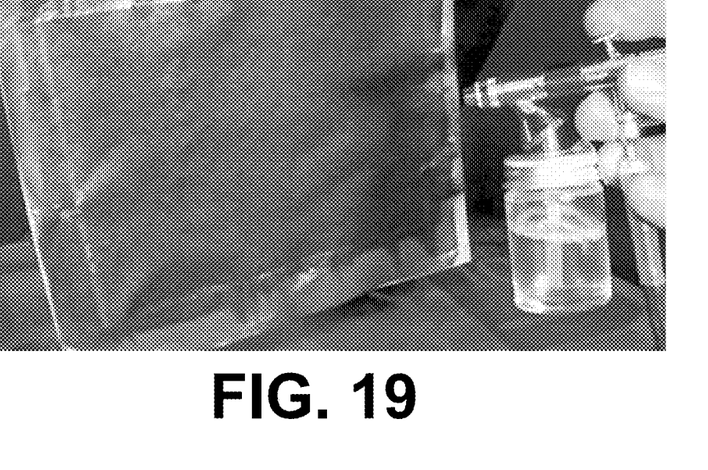
FIG. 19 illustrates the step in the method of applying polydimethylsiloxane by airbrush, which may be used to enhance the protective performance and/or style of the top surface coat.

FIG. 19 illustrates optional post-finishing steps. One such embodiment of post-finishing step is the application of polydimethylsiloxane by airbrushing. The polydimethylsiloxane enhances the performance, protect, and appearance of the additional materials that were applied by airbrushing to the flocked materials, which in the case of FIG. 19 are resins containing ferromagnetic metal micro particles. It should be understood that different types of materials/agents, including without limitation pile surface conditioning agents, may be applied during the post-finishing steps. Such materials may be rigid to flexible in nature, and may be composed of any materials/agents which have a suitable dielectric material with a relative permittivity not differing greatly from the medium surrounding the forward surface. Typical materials may include Poly silicone, polyurethane and polystyrene materials which may be solid or foam. These materials will likewise provide protection, alter the appearance or performance of the flocked materials.

Figure 20:
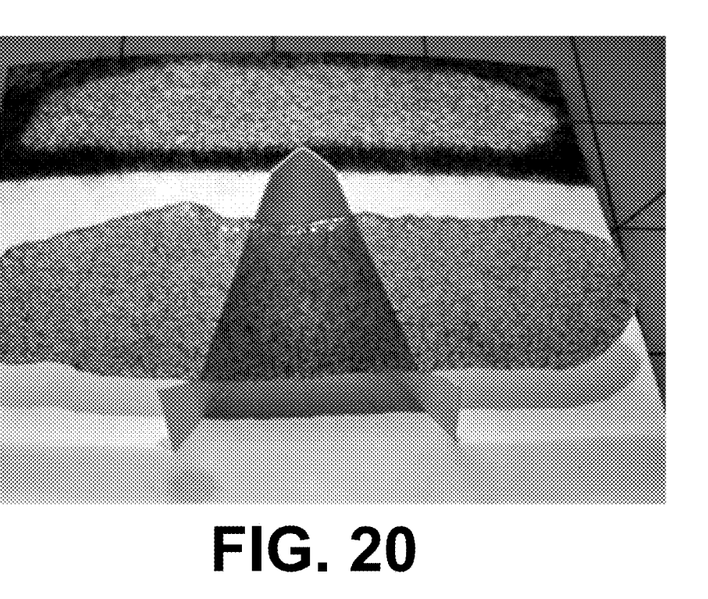
FIG. 20 illustrates additional post-finishing of the carbon fiber material, which may include encapsulation of the flock within a matrix of solids such as acrylics, melamine, epoxies or plastic deforming materials such as foams.

Finally, FIG. 20 illustrates an additional example of an optional post-finishing process. Such processes include without limitation the use of an encapsulation agent on the carbon fibers. Such encapsulation agents include but are not limited to thermoplastics, thermosetting resin polymer formulations, acrylics, melamine, epoxies or plastic deforming materials such as foams. Such materials may allow the removal of the substrate.

Having described and illustrated the principles of the disclosed invention in embodiments thereof, it should be apparent that the disclosed invention can be modified in arrangement and detail without departing from such principles. We claim all modifications and variations coming within the spirit and scope of the following claims.

The invention claimed is:
1. A method to form flocked material, comprising:
preparing carbon fiber strands;
separating carbon fiber strand clumps into carbon fiber strands;
separating carbon fiber strands into carbon fibers;
applying a bonding agent to a substrate;
electrostatically applying the carbon fibers to the substrate in a non-uniform manner; and
applying ferromagnetic metal micro particles to the carbon fibers in regions where maximum current flows using electrodeposited powder coating.
2. The method of claim 1, further comprising:
curing the substrate and carbon fibers.
3. The method of claim 1, further comprising:
applying electromagnetic modifiers.
4. The method of claim 1, further comprising:
applying pile surface conditioning agents to the electromagnetic modifiers.
5. The method of claim 1, further comprising:
applying an encapsulation agent to the carbon fibers.
6. The method of claim 1, further comprising:
removing the substrate from the carbon fibers.
7. The method of claim 1, wherein the ferromagnetic metal micro particles are applying at 15-25 kV.

* * * * *